(12) United States Patent
Nauerth

(10) Patent No.: US 7,689,264 B2
(45) Date of Patent: Mar. 30, 2010

(54) METHOD FOR PRODUCING MR (MAGNETIC RESONANCE) IMAGES OF A MOVING OBJECT USING NAVIGATOR SIGNALS

(75) Inventor: Arno Nauerth, Erlenbach (DE)

(73) Assignee: Bruker Biospin MRI GmbH, Ettlingen (DE)

( * ) Notice: Subject to any disclaimer, the term of this patent is extended or adjusted under 35 U.S.C. 154(b) by 661 days.

(21) Appl. No.: 11/471,561

(22) Filed: Jun. 21, 2006

(65) Prior Publication Data

US 2007/0038071 A1 Feb. 15, 2007

(30) Foreign Application Priority Data

Jun. 29, 2005 (DE) ........................ 10 2005 030 162
Dec. 6, 2005 (EP) ................................ 05026538

(51) Int. Cl.
*A61B 5/05* (2006.01)
(52) U.S. Cl. ....................................... 600/410; 436/172
(58) Field of Classification Search ................. 600/410; 436/172
See application file for complete search history.

(56) References Cited

U.S. PATENT DOCUMENTS

| | | | |
|---|---|---|---|
| 4,961,426 A | | 10/1990 | Spraggins |
| 5,041,790 A | * | 8/1991 | Tropp et al. .................. 324/318 |
| 6,552,541 B2 | | 4/2003 | Nauerth |
| 2003/0050554 A1 | * | 3/2003 | Schaffer ..................... 600/410 |
| 2003/0117136 A1 | | 6/2003 | Wang |

FOREIGN PATENT DOCUMENTS

| | | |
|---|---|---|
| EP | 0 994 363 | 4/2000 |
| EP | 1 391 746 | 2/2004 |
| WO | WO 01/84172 | 11/2001 |

OTHER PUBLICATIONS

Petrie, Daniel W. et al. "Optimizing Spherical Navigator Echoes for Three-Dimensional Rigid-Body Motion Detection". Magnetic Resonance in Medicine 53:1080-1087 (2005).

Ward, Heidi A. et al. "Prospective Multiaxial Motion Correction for fMRI". Magnetic Resonance in Medicine 43:459-469 (2000.).

(Continued)

*Primary Examiner*—Long V Le
*Assistant Examiner*—Saurel J Selkin
(74) *Attorney, Agent, or Firm*—Paul Vincent

(57) ABSTRACT

A method for generating MR (magnetic resonance) images of a moving object with a repeating motion pattern at comparable motion states, wherein for at least one motion state, a set of MR data which is completely encoded for producing an MR image is provided from a plurality of successive individual MR measurements. The method is characterized in that at least one contiguous region of successive data points is used as indicator within the individual MR measurement, wherein this contiguous region is identically repeated for all individual MR measurements within the respective MR measuring sequence relative to irradiated RF (radio frequency) pulses and switched gradients. This provides reliable allocation of the recorded MR data with the associated motion states, wherein completely encoded sets of MR data can be determined within an optimum time.

21 Claims, 13 Drawing Sheets

OTHER PUBLICATIONS

Hiba, B. et al. "Cardiac and respiratory double self-gated cine MRI in the mouse at 7 T". Proc. Intl. Soc. Mag. Reson. Med. 13 (2005).

A.C. Brau et al. "Self-Navigated Motion Detection Technique Generalized for Arbitrary Pulse Sequences". Proc. Intl. Soc. Mag. Reson. Med. 13, May 7, 2005, p. 508.

M.E. Crowe et al. "Automated Rectinlinear Self-Gated Cardiac Cine Imaging". Magnetic Resonance in Medicine, vol. 52, 2004, pp. 782-788.

Spraggins T.A. "Wireless Retrospective Gating: Application to Cine Cardiac Imaging". Magnetic Resonance Imaging, Tarrytown, NY, US, vol. 8, Nr. 6, 1990, pp. 675-681.

P.D. Gatehouse et al. "Respiratory navigators in non-stop cine cardiovascular SSFP imaging". Proc. Intl. Soc. Mag. Reson. Med. 12, 2004, p. 1963.

Hinks, R.S. Ed.—Society of Magnetic Resonance in Medicine: "Monitored Echo Gating (MEGA) for the Reductuion of Data Errors and Image Artifacts" Book of Abstracts of the Meeting and Exhibition of the Society of Magnetic Resonance in Medicine. San Francisco, Aug. 20-26, 1988, Meeting and Exhibition of the Society of Magnetic Resonance in Medicine, Berkeley, SMRM, US, vol. 2 Meeting 7, Aug. 20, 1988, p. 744.

Unknown "Self-Gated Projection Reconstruction Cardiac Cine Imaging". Proc. Intl. Soc. Mag. Reson. Med. 11, 2003, p. 379.

* cited by examiner

METHOD FOR PRODUCING MR (MAGNETIC RESONANCE) IMAGES OF A MOVING OBJECT USING NAVIGATOR SIGNALS

This application claims Paris Convention priority of EP 05 026 538.8 filed Dec. 6, 2005 and DE 10 2005 030 162.2 filed Jun. 29, 2005 the complete disclosures of which are hereby incorporated by reference.

BACKGROUND OF THE INVENTION

The invention concerns a method for generating MR (magnetic resonance) images of a moving object having a repeating motion pattern in comparable motion states, wherein a fully encoded set of MR data for producing an MR image is provided from a plurality of successive individual MR measurements for at least one motion state, the time period between the individual MR measurements being shorter than a repetition rate of the motion pattern, and wherein at least one data point from each individual MR measurement is used as an indicator for the comparability of several motion states.

Methods of this type for imaging moving objects are disclosed in the Journal of Magnetic Resonance in Medicine, MRM 13 (2005).

High-resolution MR images of moving objects must be recorded, in particular, for clinical applications. These are mainly recordings of the heart or abdominal region, wherein the object to be imaged moves relative to the magnetic field generated by the MR apparatus due to heart beat and breathing. The detection of a 2- or 3-dimensional image requires repeated application of imaging pulse sequences with different phase encoding gradients and reconstruction of the image. Due to a continuous motion pattern of the object which usually involves a plurality of motion states, the individual MR signals are recorded in different motion states. This can produce artefacts, such as ghostings, distortions and deterioration of the resolution in the reconstructed image.

This problem is conventionally solved by triggering the times of the individual measurements to comparable motion states of the object using external sensors. However, this requires more time, in particular, when several individual motions of different frequencies overlap. With this method, a particular flank of the trigger signal, which characterizes a certain motion state of the object, must always be waited for. The spin system could therefore be in different relaxation states which, in turn, produces different signal strengths.

Another approach which avoids external trigger signals is the "back projection" method. An indicator is recorded with full rephasing of the spins without using a phase encoding gradient, such that the echo maximum is recorded as the indicator. Since the motion pattern of the object can result in amplitude fluctuations of the indicator signal, a certain size of the amplitude can be associated with a corresponding layer of the object to be imaged. However, this method cannot be applied to 2D-FT methods due to spin dephasing. Another disadvantage is the fact that only one point, i.e. the echo maximum, serves as the indicator. This can cause inaccuracies in the determination of the motion state.

U.S. Pat. No. 6,552,541 B2 describes a method for correcting disturbing influences on the MR signals of a substance disposed in the measuring volume of an MR apparatus, wherein an RF excitation pulse is irradiated onto the substance, and a time-dependent MR signal generated thereby is detected and digitized in a phase-sensitive manner. A temporal behavior of the phase of the MR signal related to a predetermined reference phase of a reference signal is determined from the temporal behavior of the detected and digitized MR signal, is digitized and used to determine one or several correction or control values. In this method, almost any measuring point is used to determine the magnetic field deviation and for control. This ensures great control accuracy.

It is the underlying purpose of the invention to propose a method for generating MR images of a moving object which reliably allocates the recorded MR data with the associated motion states, thereby determining completely encoded MR data sets within an optimized period of time.

SUMMARY OF THE INVENTION

This object is achieved in accordance with the invention in that at least one contiguous region of successive data points is used as an indicator within the individual MR measurement, wherein this contiguous region is identically repeated for all individual MR measurements within the respective MR measuring sequence relative to the irradiated RF (radio frequency) pulses and switched gradients.

The inventive method obtains additional information from an MR experiment to determine the motion states of the motion pattern. In this fashion, the recorded individual measurements can be exactly associated with one motion state. In order to reconstruct an MR image, only those signals are used which were associated with a certain motion state using the contiguous region of individual data points (indicator). The relevant motion states may thereby be differently classified for different applications (e.g. motion state 1: breathing phase, motion state 2: diastole during breathing pause, motion state 3: systole during breathing pause etc.). A motion state need not necessarily contain only one single momentary recording of the motion state but may comprise one motion phase. The set of MR data which is completely encoded to produce an MR image can be recorded within the scope of the inventive method or be extracted from previous measurements.

The contiguous regions of successive data points used as the indicator are recorded in identical dephasing states of the nuclear magnetization. In contrast to conventional methods, the use of this indicator in the inventive method therefore permits highly accurate association of the individual measurements with the corresponding motion states.

The inventive method provides recording of a plurality of MR data of different motion states and reliable allocation of the recorded data to the corresponding motion states within a short time. This again eliminates or at least largely reduces artefacts in the resulting MR images.

The contiguous region advantageously comprises a partial region without gradients, wherein the nuclear spin system is rephased in this partial region. In this fashion, the full signal contributes to the indicator.

In an advantageous variant of the inventive method, the contiguous region comprises a partial region with applied rephasing gradient, in particular, a slice selection gradient, thereby rephasing the nuclear spin system in this partial region. This reduces the measuring time for the indicator, wherein the rephasing process still obtains acceptable signal strength.

The individual MR measurements advantageously include gradient echo measurements. They are characterized by short repetition times to obtain unambiguous and fast determination of the motion pattern. In principle, the inventive method may also be performed with other pulse sequences.

In order to further shorten the measuring time, the individual MR measurements advantageously include multi-slice excitations, yielding a multiple of measuring data without reducing the signal intensity and with the same repetition time as in an individual measurement.

With particular advantage, further individual MR measurements are performed with a second nuclear species at the same time as the individual MR measurements of a first nuclear species to determine the indicator. The indicator may thereby be measured with a higher temporal resolution without disturbing the actual data recording. Moreover, nearly any slice thickness can be used to obtain the indicator signal with optimized indicator signal amplitude, while the individual measurements may be performed with thin slices to obtain high spatial resolution. It is therefore not problematic when the signal strength per unit volume of the second nuclear species is less than the signal intensity of the first nuclear species.

In one variant of the inventive method, no gradient is applied in the contiguous region, and an RF excitation pulse with small flip angle is applied before the contiguous region. This causes broadband excitation, such that the entire volume contributes to the indicator signal without considerably extending the measuring sequence, as is of particular interest for multi-slice recordings. Pulse angles of less than 10° are typically used.

In an advantageous further development of this variant, the data points of the contiguous region are generated outside of the measuring volume of the MR images using a previous slice-selective excitation. The volume used for measuring the indicator signal may then be selected to ensure that the recording of the indicator signal has no disturbing influence on the measuring volume of the individual MR measurements, while also achieving a high scanning rate.

In a further development of this variant, the measuring volume is a slice whose plane is tilted relative to the slice plane of the slice-selective excitation. This permits precise triggering to a motion pattern outside of the measuring volume.

In an advantageous further development, the slice-selective excitation is additionally used for saturating nuclear spins of fluids flowing into the measuring volume, in particular, incoming blood. Signals of the incoming fluids can thereby be suppressed without separate saturation excitation. The saturation slice can be freely selected but is usually selected to be parallel to the slice of the measuring volume.

Moreover, it may be advantageous to perform excitation and recording of the data points of the contiguous region prior to the RF pulse for recording the MR data.

In the inventive method, complete data sets for a plurality of motion states may advantageously be provided for generating MR images corresponding to the respective motion state. The object can thereby be imaged in different motion states.

In order to illustrate the motion pattern, a periodically running film may be produced from the MR images.

In the inventive method, the successive data points comprise an MR signal amplitude and/or an MR signal phase in the contiguous region, and are processed with a predetermined mathematical algorithm to obtain a parameter characterizing the motion state.

The algorithm preferably comprises a polynomial fit, in particular of zero and/or first order.

The algorithm may advantageously be filtered. The motions of the motion pattern which are not relevant for the observer may thereby be filtered out. The influence of the heart beat on the motion pattern of the object alone can e.g. be observed in a motion pattern caused by breathing and heart beat of a living object through corresponding filtering.

In a particularly preferred variant of the inventive method, the completeness of the recorded data sets is checked on-line during the MR measurements, wherein the MR measurements are terminated when complete.

In a particularly advantageous manner, the recorded data sets are checked for completeness on-line during the MR measurements, and the subsequent individual MR measurements are precisely limited to those whose data sets are incomplete at the time of checking. The recording time is thereby minimized. This may be performed for one single motion state and also for a plurality of motion states at the same time. The phase encoding steps are thereby adjusted in correspondence with the missing data.

The recording time of the overall measurement may be further reduced by selecting the number of individual MR measurements to be sufficiently high that the statistical probability of complete data sets exceeds a predetermined threshold, in particular, is larger than 50%.

In a further development of this variant, the MR measurements are recorded according to a multi-dimensional Fourier method, with the threshold for smaller values in K space being selected to be larger than for large values in K space.

In an alternative further development of the method, the MR measurements are recorded using a multi-dimensional Fourier method, wherein the incompleteness of the data sets for large values in K space is deliberately accepted, and the missing values are supplemented through interpolation between neighboring obtained data sets. A missing value may also be substituted by the value of a data set which is associated with a neighboring motion state.

The indicator is preferably determined from a predetermined maximum admissible change of the motion state.

In an advantageous embodiment of the inventive method, the overall duration of recording of the plurality of successive individual MR measurements is deliberately selected to be asynchronous to the repeating motion pattern, such that, during repeated recordings of the plurality of successive individual MR measurements, identical points in K space are recorded at different phases of the motion state.

It is also advantageous to detect and mathematically compensate for the influence of systematic disturbances on the indicator, in particular, through switched gradients. This prevents erroneous allocation of individual MR images with the motion phases of the object to be investigated. This detection of the influence of systematic disturbances on the indicator may also be performed through previous measurement of the disturbances, e.g. using an MRI phantom.

One possibility to reduce disturbances through switching of the phase encoding gradient is to perform phase encoding with twice the increment from the maximum negative phase encoding value to the maximum positive phase encoding value, and to also perform the missing intermediate steps with twice the decrement from the maximum positive to the negative phase encoding value. This reduces signal changes due to eddy current effects which occur during transition from the maximum positive to the maximum negative phase encoding value, and could be erroneously interpreted as breathing or heart beat, thereby facilitating evaluation of the data.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

DESCRIPTION OF THE PREFERRED EMBODIMENT

The recording of high-resolution MR images of moving objects may produce artefacts in the MR images due to the relative motion of the object to be imaged relative to the magnetic field of the MR apparatus, since the position and/or extension of the object constantly changes due to motion. The motion may e.g. be caused by breathing and heart beat of a living object. Artefacts induced by motion may also occur during imaging using MR methods of mechanical objects which may include e.g. flow sequences (periodically switching valves), since successive individual measurements may be taken in different motion states. The time between excitation of neighboring slices can be greatly reduced using multi-slice excitation, but imaging rapidly moving objects (e.g. hearts) without artefacts is thereby not possible.

Figure 1B:
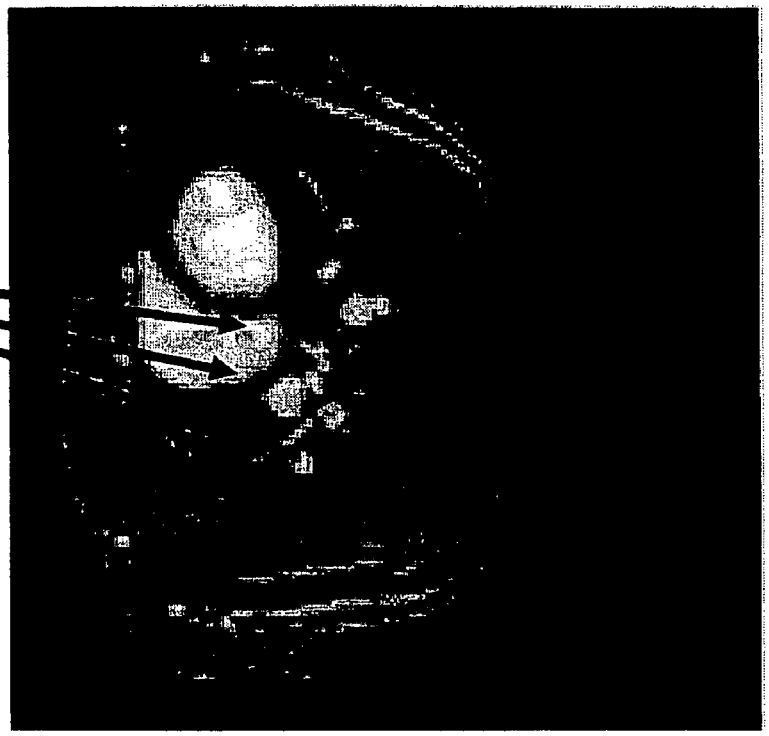
FIGS. 1a, b show MR recordings of a rat (transverse section through the heart) with artefacts resulting from breathing and heart beat motions.
Figure 1A:

FIGS. 1a and 1b show transverse sections through the heart of a rat with different artefacts induced by motion such as "ghosting" G, "distortion" D (FIG. 1a) and insufficient resolution A (FIG. 1b) recorded by a conventional MR method.

Figure 2:
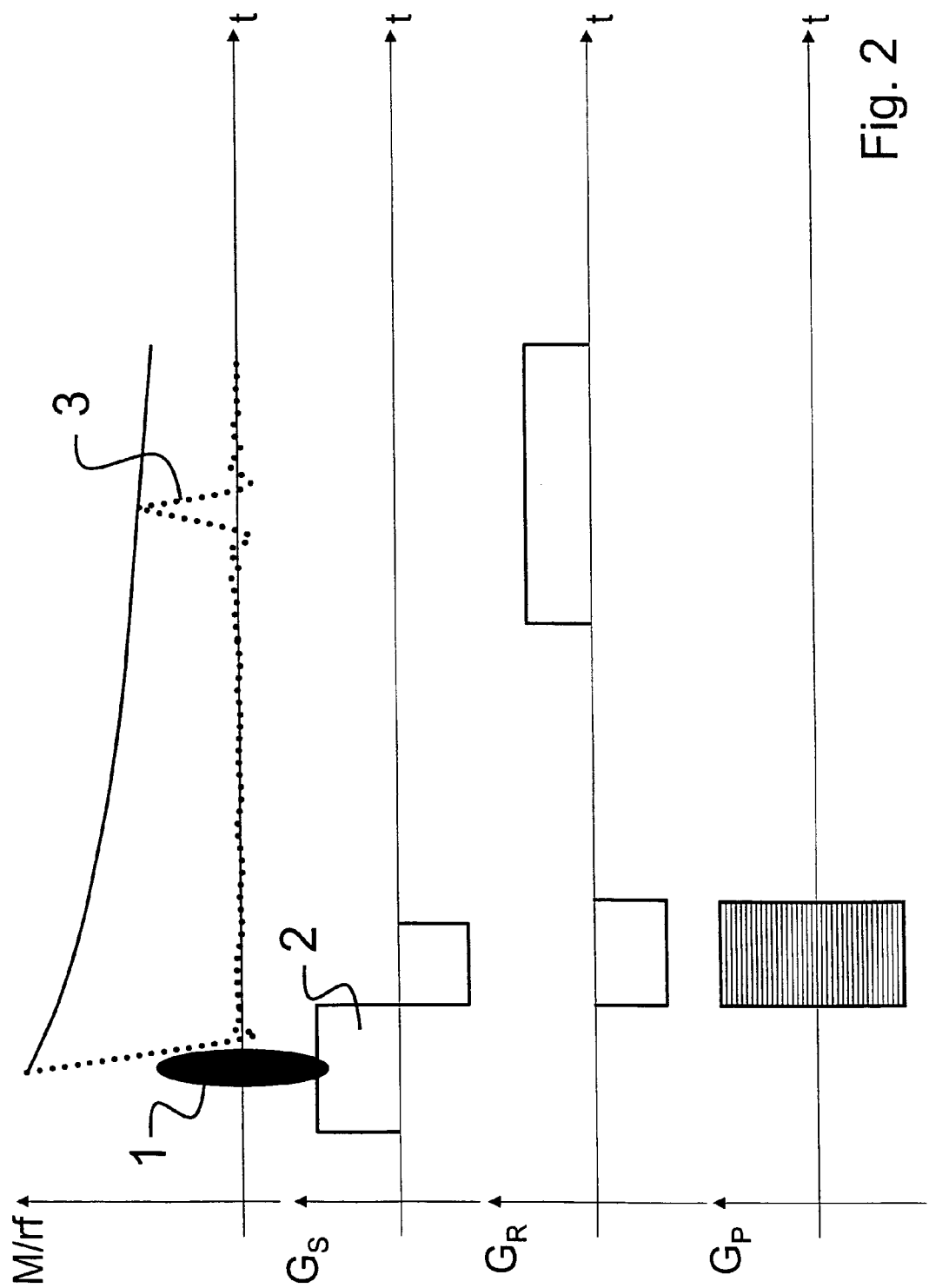
FIG. 2 shows a conventional pulse and gradient sequence.

FIG. 2 shows a conventional pulse and gradient sequence. An RF (radio frequency) pulse 1 is irradiated on the object in the presence of a slice selection gradient $G_S$ pulse 2. After phase encoding by a phase encoding gradient $G_P$, the echo signal 3 is read out using a read gradient $G_R$.

The present invention eliminates or at least greatly reduces the occurrence of such artefacts. The individual measurements are thereby designed such that a region 4a-f of contiguous data points of each individual measurement can be used as an indicator to identify the motion state during which the individual measurement was taken. FIGS. 3 through 8 show different possibilities of performing the individual measurements in order to obtain the desired information. Suitable evaluation of these regions 4a-f permits allocation of the individual measurements to certain motion states, such that the present MR data can be selected and/or sorted. In this fashion, data of undesired motion states can be dismissed, and MR images of the object in different motion states can be produced.

In contrast to conventional methods, wherein only one single point, i.e. the echo maximum, serves as an indicator for the respective motion state, the inventive method uses a whole region of successive data points which characterize the motion state of the object not only through the value of their amplitudes but also through their relative mutual positions. This considerably improves the identification precision of the motion state of the object during the respective individual measurement.

Figure 3:
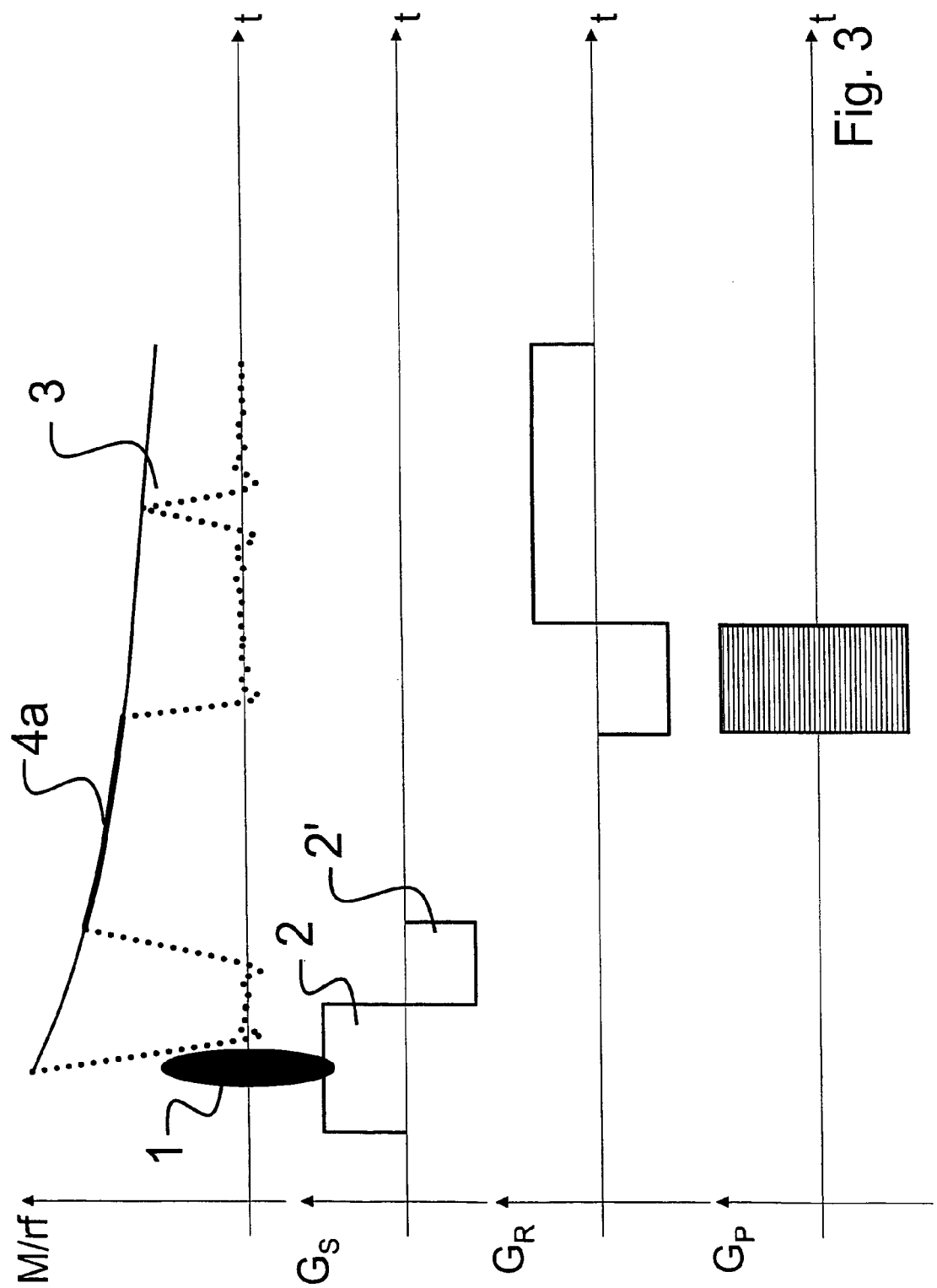
FIG. 3 shows an inventive pulse and gradient sequence with navigator scan for determining an indicator in accordance with the invention.

FIG. 3 shows a pulse and gradient sequence of a variant of the inventive method. Phase encoding is performed at a later time compared to the gradient sequence of FIG. 2, such that, after irradiation of the RF pulse 1, the spins are rephased using a rephasing gradient pulse 2'. The development of the system magnetization is observed or recorded during the RF excitation and phase encoding (navigator scan). The region 4a of successive data points (indicator signal) of this recording may serve as an indicator for the respective motion state of the object during the corresponding individual measurement in the inventive method. Region 4a of FIG. 3 is selected such that the successive data points of this region 4a are recorded with a rephased nuclear spin system. The navigator scan is followed by phase encoding and reading-out of the echo signal.

Figure 4:
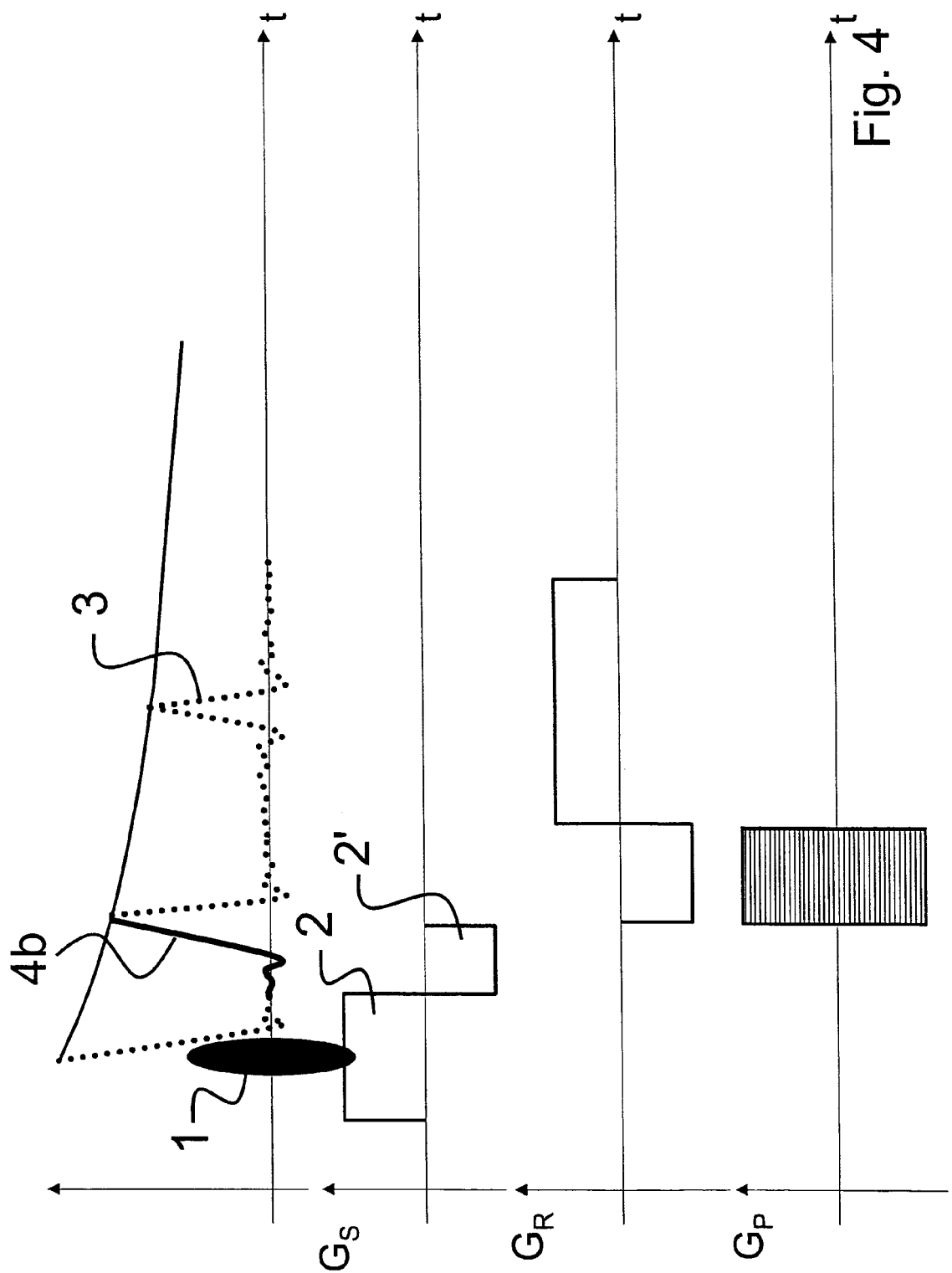
FIG. 4 shows an inventive pulse and gradient sequence with navigator scan during rephasing.

In order to reduce the duration of the individual measurement, the region 4b may be selected as indicator whose successive data points were already recorded during rephasing of the spins in response to the rephasing gradient pulse 2' (FIG. 4). The navigator scan is therefore terminated at an earlier time such that phase encoding and reading-out of the echo signal may also be performed at an earlier time. The gradient sequence of FIG. 4 is optimized in such a manner that a gradient pulse can be applied at any time. The region 4b comprises only one single data point which was recorded with full rephasing of the spins, but the data points of the region 4b recorded during the rephasing process are also characteristic for the motion state of the object at the time of recording, and therefore contribute to identification of that motion state.

Figure 5:
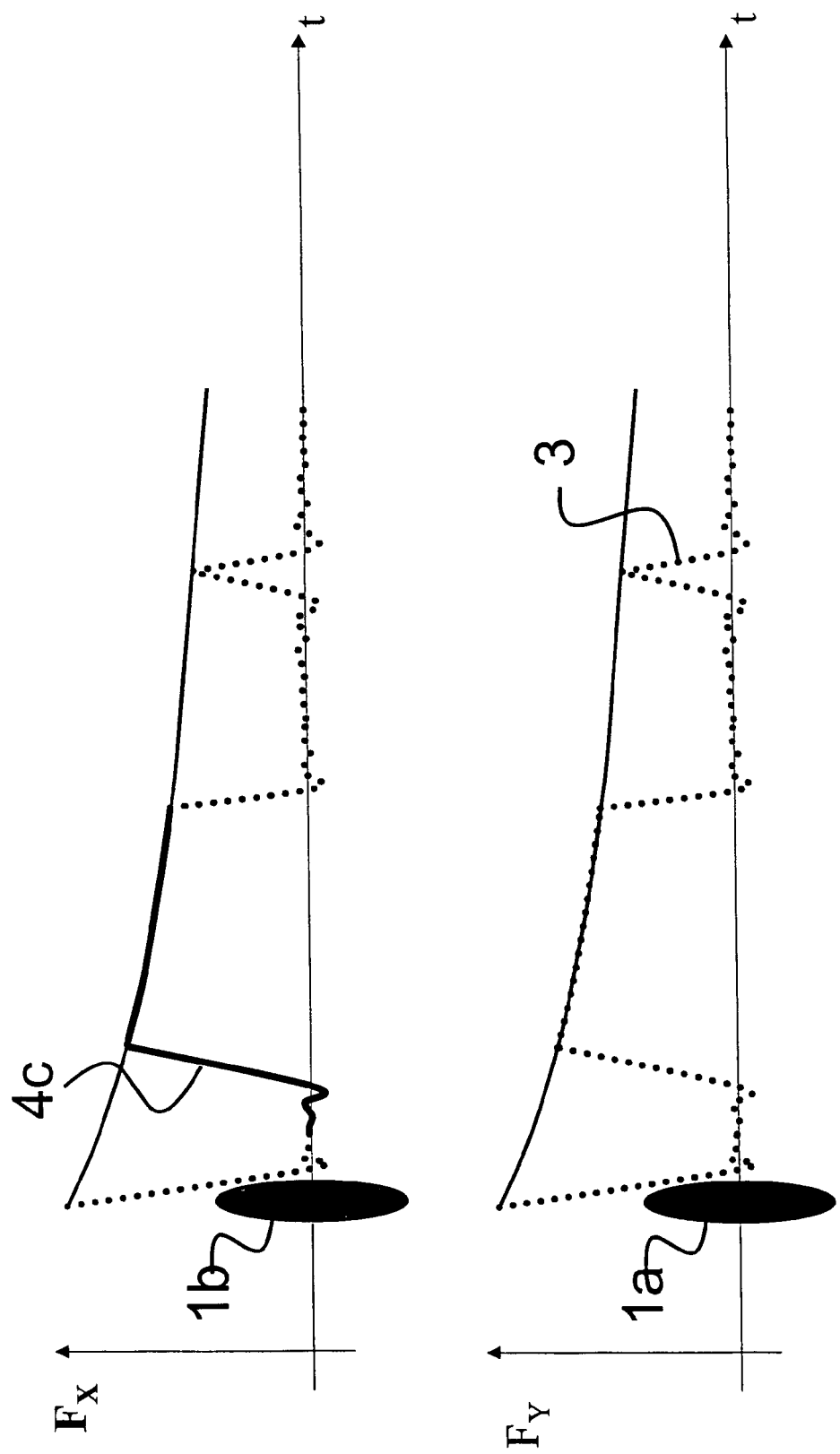
FIG. 5 shows the development of magnetization during a navigator scan and an echo scan with different nuclear species.

In order to optimize the signal strength and temporal resolution of the indicator signal, the recordings of the region 4c and the echo signal 3 may be performed with different nuclear species $F_x$, $F_y$. FIG. 5 shows the magnetization development during a navigator scan and an echo scan with different nuclear species each of whose spins are excited using one respective RF pulse 1a, 1b. $^{11}$Na nuclei are e.g. suited to measure the indicator signal. The signal strength of the MR signal per volume of these nuclei is weaker than that of $^{1}$H nuclei. Since a volume of any thickness can be used to measure the indicator when different nuclei are used, this method still realizes far higher amplitude strengths for recording the region 4c.

Figure 6:
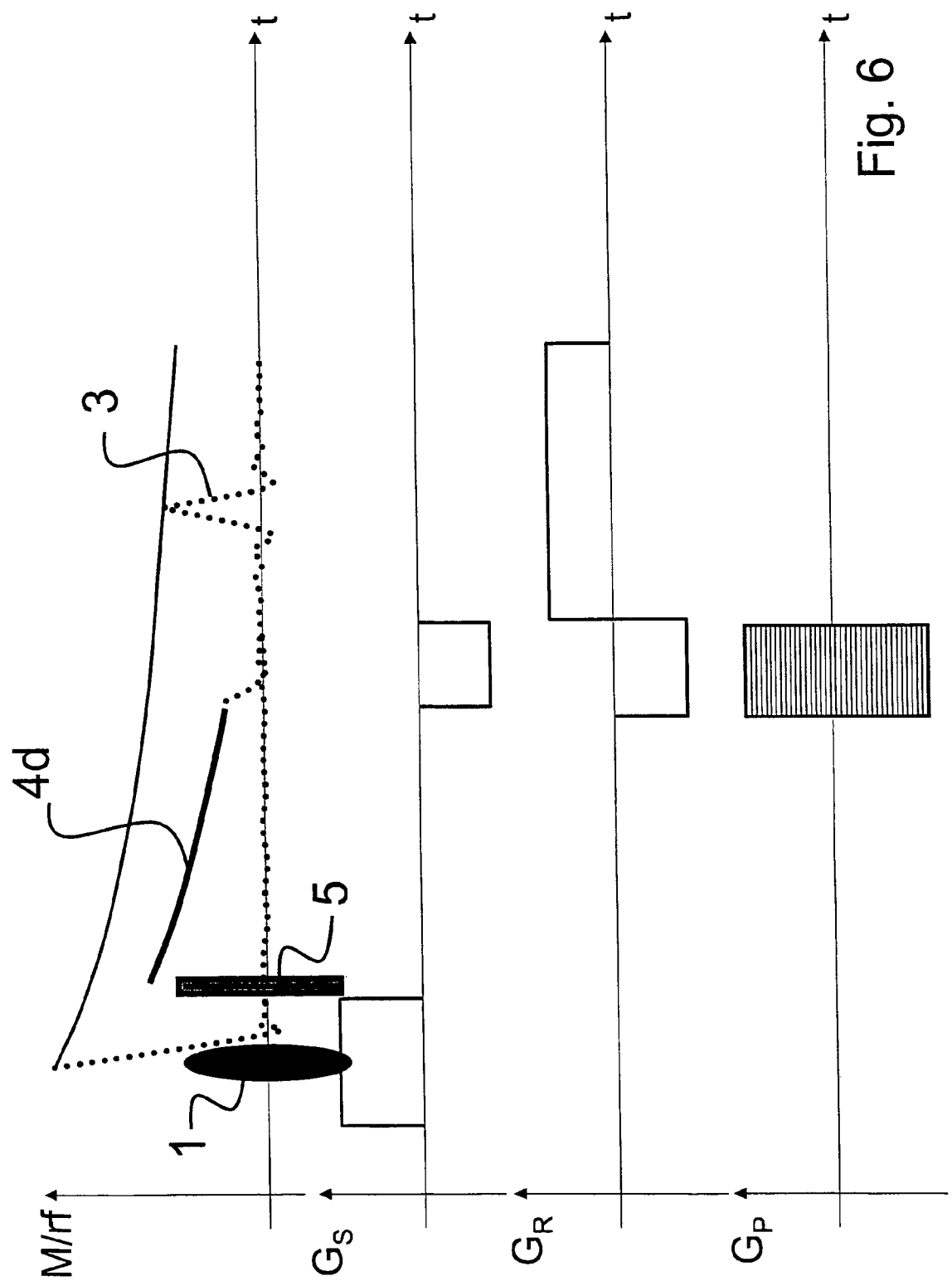
FIG. 6 shows an inventive pulse and gradient sequence with broadband excitation to determine the indicator.
Figure 7:
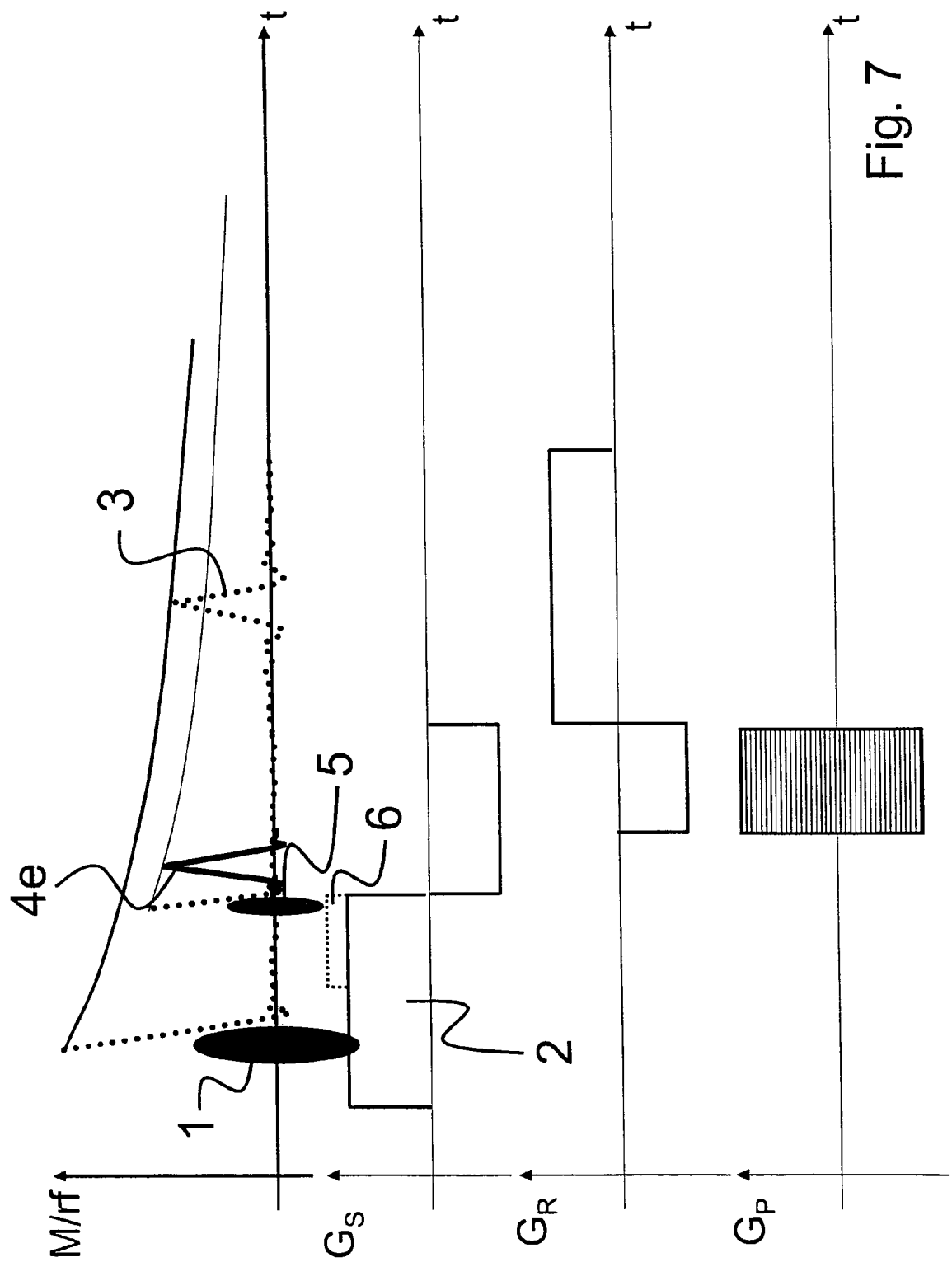
FIG. 7 shows an inventive pulse and gradient sequence to determine the indicator with the presence of an additional slice selection gradient.
Figure 8:
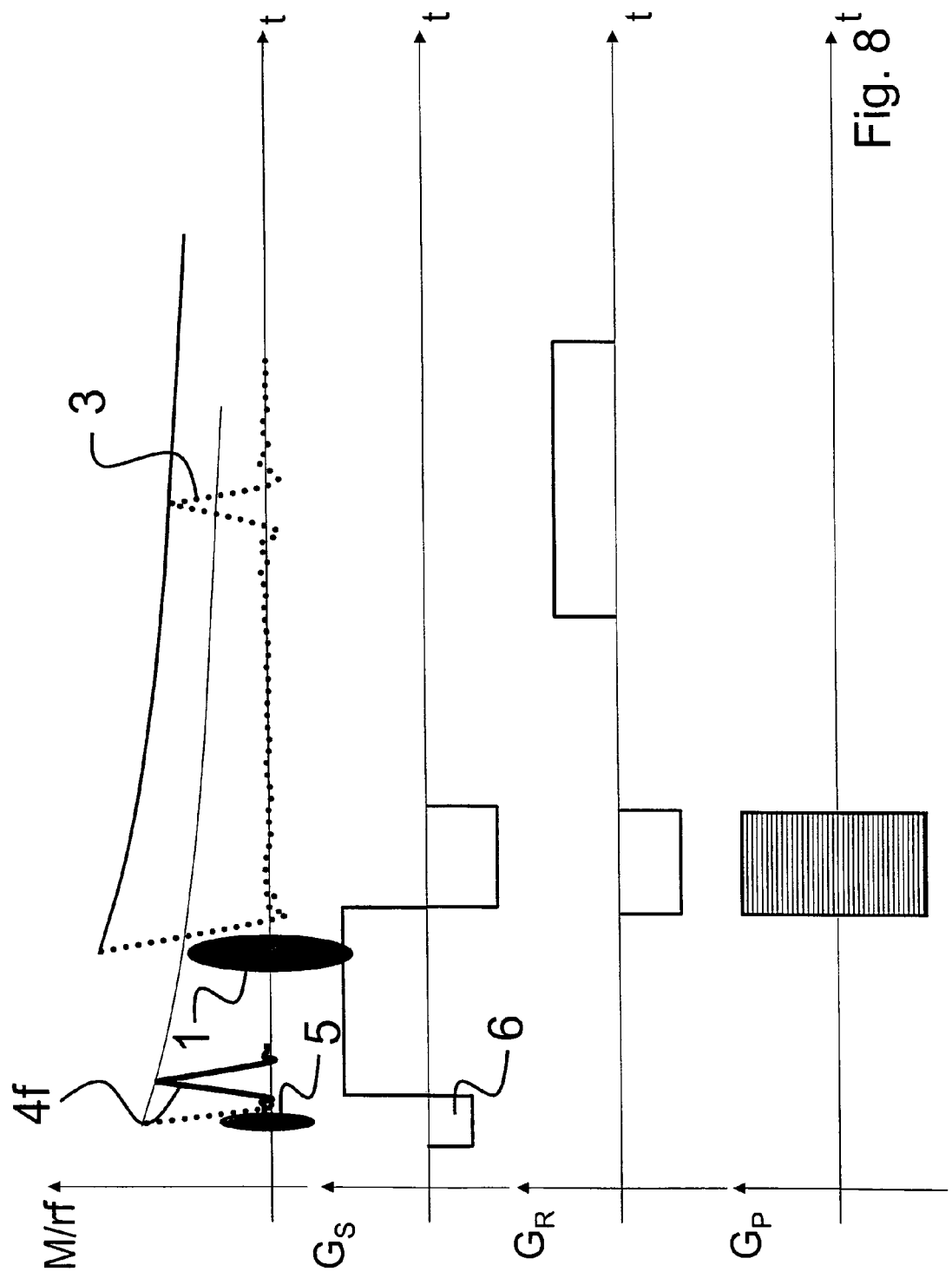
FIG. 8 shows an inventive pulse and gradient sequence with upstream navigator scan with the presence of a slice selection gradient to determine the indicator.

In the variant of FIG. 6 of the inventive method, an additional RF excitation pulse 5 with small flip angle is irradiated after RF excitation using RF pulse 1. During the RF excitation pulse 5 and the following recording of the contiguous region 4d which serves as the indicator, no gradients are switched, such that the overall volume of the object irradiated with the RF excitation pulse 5 contributes to the signal strength of the region 4d (indicator signal). It must thereby be observed that, in this case, the magnetization in the echo signal measured as the indicator signal is missing.

If the indicator signal is not to be obtained from the overall volume of the object, any slice of the object may be selected for measuring the region 4e (indicator signal) through application of an additional pulse 6 of the slice selection gradient $G_S$. In particular, it may thereby be taken into consideration that the slice selected by the pulse 6 is not within the region of the slice defined by the pulse 2 of the slice selection gradient $G_S$ in which the echo signal 3 is measured. The RF excitation pulse 5 with additional pulse 6 of the slice selection gradient $G_S$ can thereby be applied after (FIG. 7) or before (FIG. 8) RF pulse 1. In particular, this variant may also be applied to multi-slice recordings. Multi-slice recording of a heart may be performed e.g. in that one half of the heart is initially examined using individual multi-slice MR measurements, while the indicator signals are obtained from the other half of the heart using a suitable slice selection gradient, and subsequently performing the indicator measurements with that half of the heart already investigated by individual MR measurements using another slice selection gradient, such that the second half of the heart can also be recorded without disturbance using measurements of the echo signals 3.

Figure 9A:
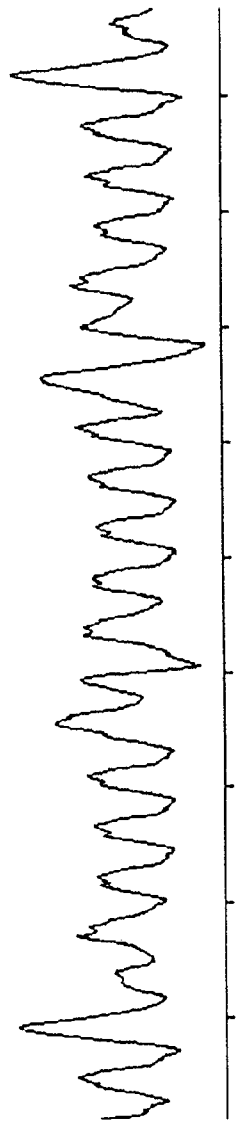
FIGS. 9a-d show graphic representations of a motion pattern over time obtained from the amplitude signals of the navigator scans.
Figure 9B:
Figure 9C:
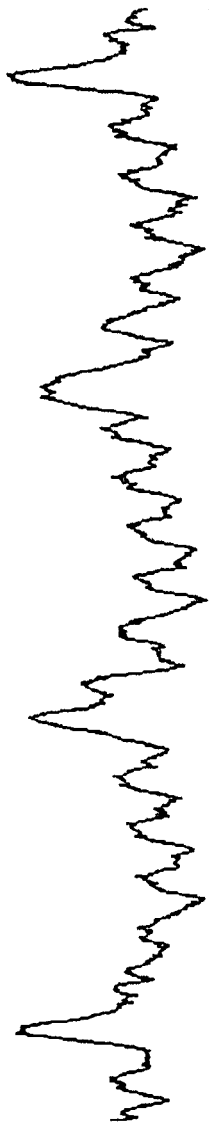
Figure 9D:

The regions 4a-f recorded during the individual measurements are processed using a mathematical algorithm. FIGS. 9a-d show motion patterns determined from the amplitude signals of a plurality of recorded regions 4 using different algorithms. The object was a living rat. FIG. 9a shows the time behavior of the average values (polynomial fit of zero order) of the amplitude signals of the individual regions. FIG. 9b shows the derivative of the curve of FIG. 9a. As an alternative or supplement, the motion pattern may also be determined using a linear regression (polynomial fit of first order) (FIG. 9c). FIGS. 9a and 9c show, in particular, that the shape of the curves results from two overlapping frequencies which can be associated with the breathing and heart frequency of the rat. FIG. 9d shows the derivative of the curve of FIG. 9c. The different representations of FIGS. 9a-d are useful, since they more clearly show different aspects of the motion pattern. In the example of FIGS. 9a-d, as plotted in FIG. 9c, the breathing of the rat is shown much more clearly than in the curve of FIG. 9a, determined from the polynomial fits of zero order. This is a considerable improvement compared to prior art. The motion pattern cannot be shown using polynomial fits of first order of the indicator signals in conventional methods, since one single data point cannot be fit to a polynomial of first order.

Figure 10A:
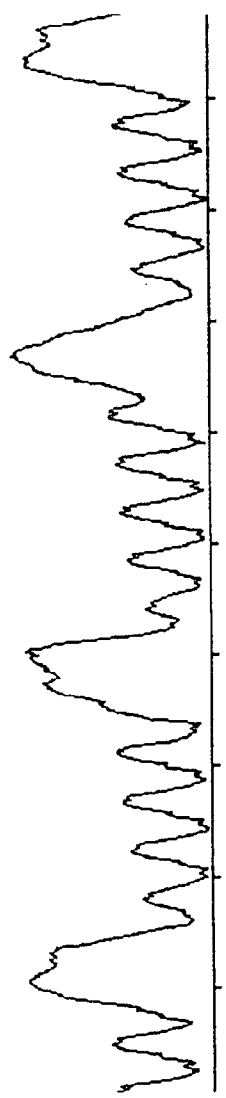
FIGS. 10a-d show graphic representations of a motion pattern over time obtained from the phase signals of the navigator scan with different algorithms.
Figure 10B:
Figure 10C:
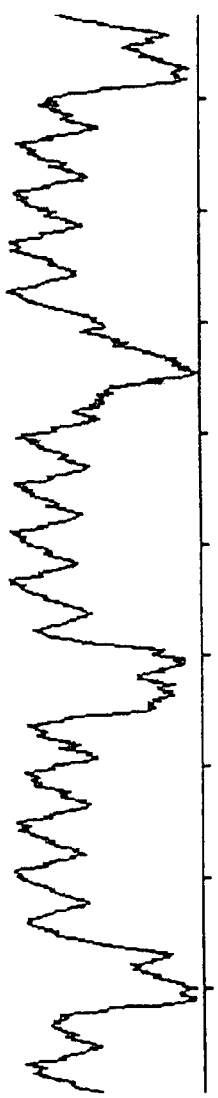
Figure 10D:
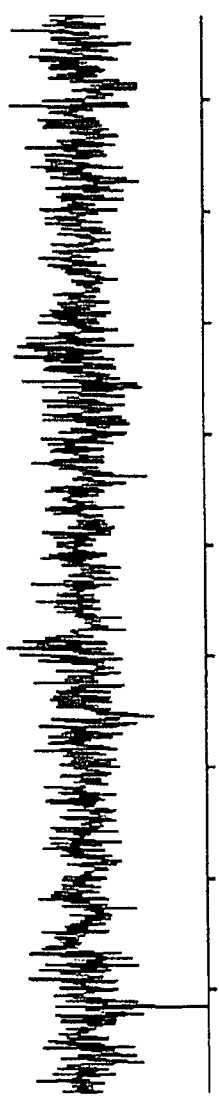

FIGS. 10a through d show the motion patterns determined from the phase signals of neighboring regions 4 which were determined using a polynomial fit of zero order (FIG. 10a), derivative thereof (FIG. 10b), polynomial fits of first order (FIG. 10c) and the derivative thereof (FIG. 10d).

Figure 11A:
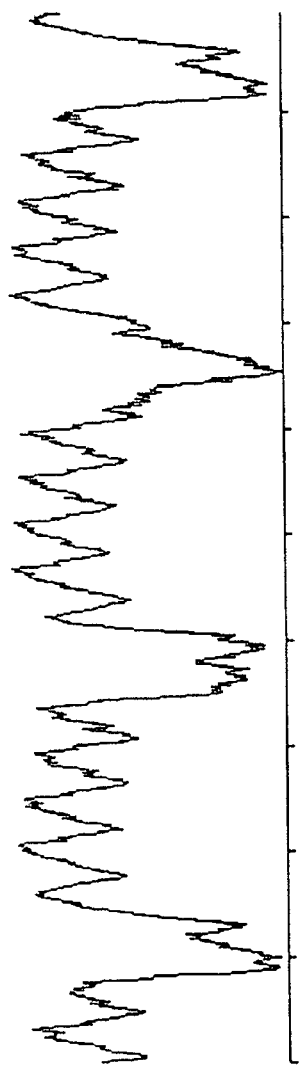
FIGS. 11a-c show graphic representations of the motion pattern from FIG. 10a with separated patterns of breathing and heart beat.
Figure 11B:
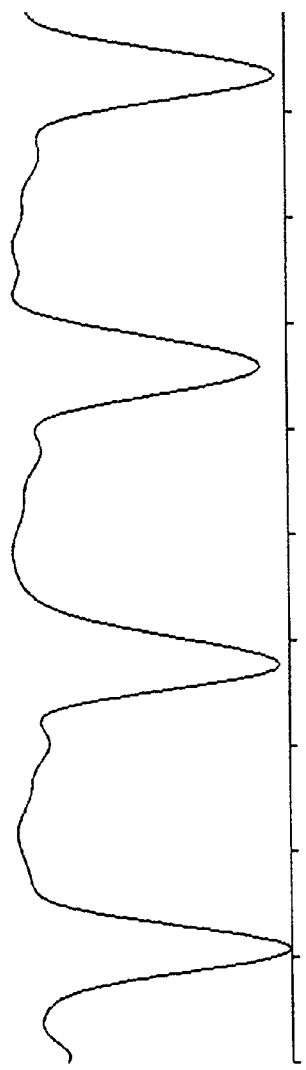
Figure 11C:
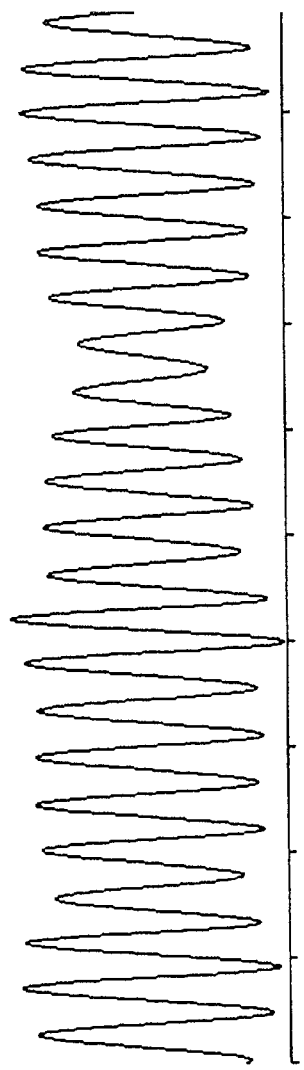

Using a data processing program with a certain amount of predetermined parameters, the motions caused by heart beat and breathing of the examined rat which overlap in FIG. 11a (corresponding to FIG. 10c) and form a motion pattern (FIGS. 11b, c) can be separated.

Figure 12A:
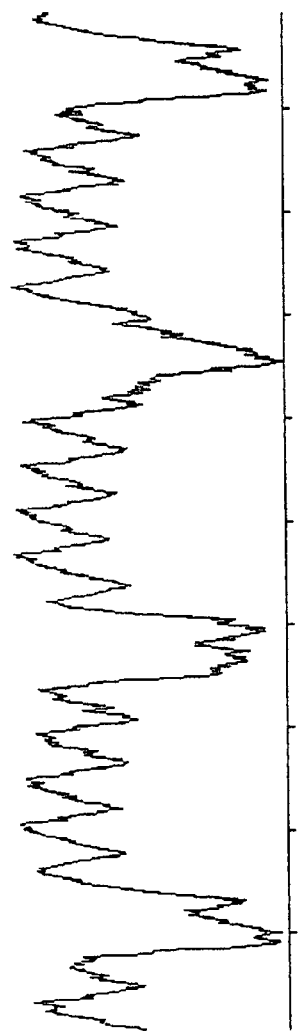
FIGS. 12a-c show graphic representations of the motion pattern of FIG. 10a with separated patterns of breathing and heart beat with different parameters compared to FIGS. 11b, c.
Figure 12B:
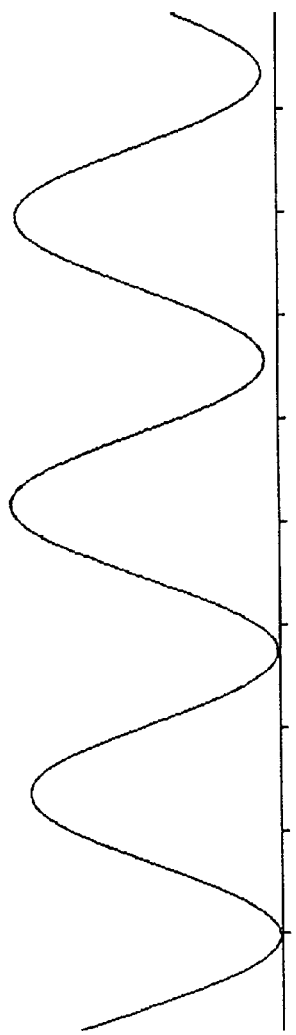
Figure 12C:
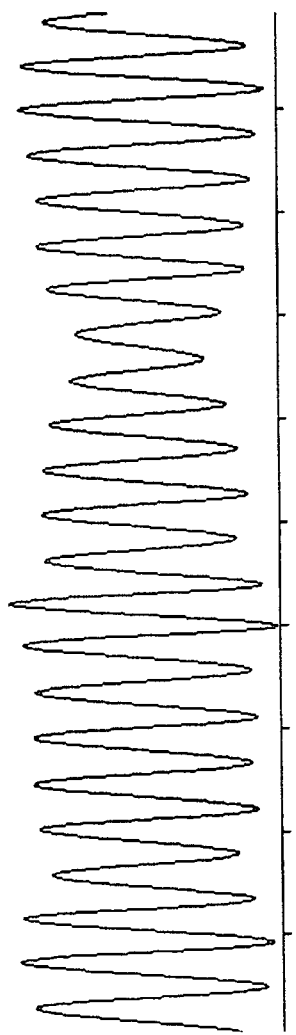

FIGS. 12a-c show separation of the motions caused by heart beat and breathing with changed parameters.

The separated motions can be divided into partial motion states which can be shown in a 2D matrix. Each entry of the 2D matrix shows a motion state of the object to which the individual measurements can be associated.

Figure 13A:
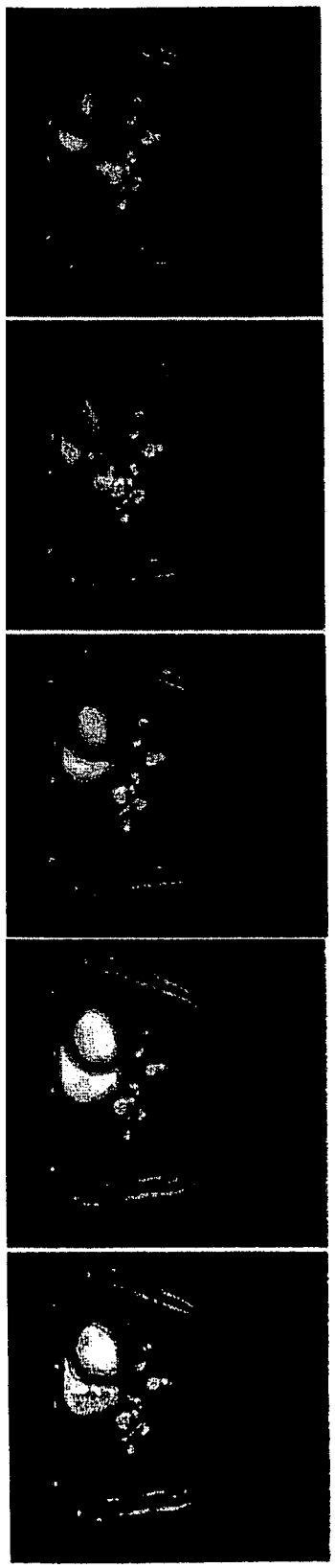
FIG. 13a shows successive MR images of a film of the heart motion of a rat recorded with the inventive method.
Figure 13B:
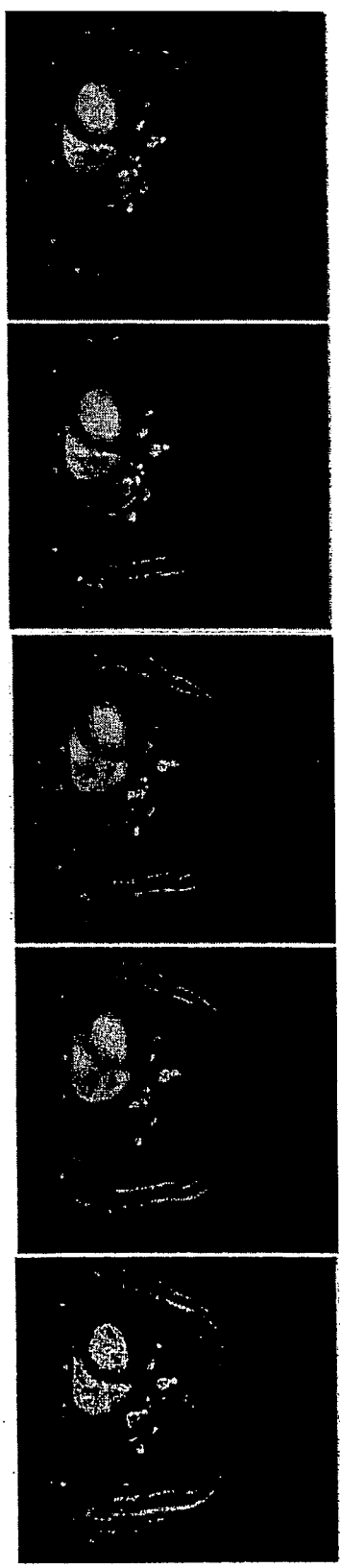
FIG. 13b shows successive MR images of a film of the breathing motion of a rat recorded with the inventive method.

Separation of the individual motions also permits generation of films of the recorded object which only show motion of the motion pattern (e.g. only breathing of the examined animal) such that the influence of this motion on the object alone can be studied. FIG. 13a shows e.g. images of a film of the beating heart of a rat with "held breath" while FIG. 13b shows the influence of the same rat's breathing during an "apparent heart standstill".

LIST OF REFERENCE NUMERALS

1 RF pulse
2 pulse of a slice selection gradient
2' rephasing gradient pulse
3 echo signal
4 region
5 RF excitation pulse with small flip angle
6 additional pulse of a slice selection gradient $G_S$
A insufficient resolution
D distortion
G ghosting
$G_R$ read gradient
$G_P$ phase encoding gradient
$G_S$ slice selection gradient

I claim:

1. A method for generating MR (magnetic resonance) images at comparable motion states of a moving object the object, having a repetitive motion pattern, wherein the images are obtained through excitation of a nuclear spin system within the object, the method comprising the steps of:
   a) selecting at least one contiguous region of successive data points as an indicator for a comparability of motion states;
   b) executing an MR measuring sequence with an excitation RF pulse applied in a presence of a first slice selection gradient having a first polarity, wherein all irradiated RF (radio frequency) pulses and switched gradients applied prior to or during occurrence of the contiguous region of step a) remain substantially unchanged for each individual MR measurement of the sequence, the individual measurements having a time separation which is shorter than a repetition rate of the motion pattern; and
   c) encoding MR data of step b) to produce an MR image of at least one motion state from the individual measurements, wherein the contiguous region comprises a partial region in which a second slice selection gradient is applied having a second polarity which is opposite to the first polarity of the first slice selection gradient, thereby rephasing the nuclear spin system in the partial region.

2. The method of claim 1, wherein the individual MR measurements comprise gradient echo measurements.

3. The method of claim 1, wherein the individual MR measurements comprise multi-slice excitations.

4. The method of claim 1, further comprising performing further individual MR measurements using a second nuclear species at a same time as the individual MR measurements of a first nuclear species to determine the indicator.

5. The method of claim 1, wherein data points of the contiguous region are generated by a preceding slice-selective excitation, outside of a measuring volume of the MR image.

6. The method of claim 1, wherein an RF pulse for recording data is preceded by excitation and recording of data points of the contiguous region.

7. The method of claim 1, wherein full data sets for a plurality of motion states are provided for generating MR images which correspond to the respective motion state.

8. The method of claim 1, wherein the successive data points in the contiguous region have an MR signal amplitude and/or an MR signal phase and are processed with a predetermined mathematical algorithm to extract a parameter characterizing the motion state.

9. The method of claim 1, wherein a completeness of recorded data sets is tested on-line during the MR measurements, and the MR measurements are terminated upon reaching completeness.

10. The method of claim 1, wherein a completeness of recorded data sets is tested on-line during the MR measurements, and subsequent individual MR measurements are limited to precisely those with incomplete associated data sets at a time of checking.

11. The method of claim 1, wherein a number of individual MR measurements is selected sufficiently high such that a statistical probability for completeness of data sets exceeds a predetermined threshold or exceeds 50%.

12. The method of claim 1, wherein the indicator is determined from a predetermined maximum admissible change of the motion state.

13. The method of claim 1, wherein an overall duration of a recording of a plurality of successive individual MR measurements is deliberately selected to be asynchronous with the repeating motion pattern.

14. The method of claim 1, wherein an influence of systematic disturbances on the indicator or an influence of switched gradients is detected and mathematically compensated for.

15. The method of claim 5, wherein the measuring volume is a slice whose plane is tilted relative to a slice plane of a slice-selective excitation.

16. The method of claim 15, wherein the slice-selective excitation is additionally used for saturating nuclear spins from fluids or of blood flowing into the measuring volume.

17. The method of claim 7, wherein a periodically running film is produced from the MR images.

18. The method of claim 8, wherein the algorithm comprises a polynomial fit or a polynomial fit of zero and/or first order.

19. The method of claim 8, wherein the algorithm comprises filtering.

20. The method of claim 9, wherein the MR measurements are recorded using a multi-dimensional Fourier method, and an incompleteness of data sets is deliberately accepted for large values in K space, missing values being supplemented through interpolation between existing neighboring data sets.

21. The method of claim 11, wherein the MR measurements are recorded using a multi-dimensional Fourier method, and a threshold for smaller values in K space is selected to be larger than for large values in K space.

* * * * *